US008405299B2

(12) United States Patent
Toda et al.

(10) Patent No.: US 8,405,299 B2
(45) Date of Patent: Mar. 26, 2013

(54) LIGHT SOURCE APPARATUS

(75) Inventors: Naohiro Toda, Osaka (JP); Hiroki Noguchi, Sanda (JP); Kenichiro Tanaka, Neyagawa (JP)

(73) Assignee: Panasonic Corporation (JP)

( * ) Notice: Subject to any disclaimer, the term of this patent is extended or adjusted under 35 U.S.C. 154(b) by 622 days.

(21) Appl. No.: 12/654,459

(22) Filed: Dec. 22, 2009

(65) Prior Publication Data

US 2010/0157573 A1 Jun. 24, 2010

(30) Foreign Application Priority Data

Dec. 19, 2008 (JP) ................................ 2008-324506

(51) Int. Cl.
*H01L 33/50* (2010.01)
*H01L 33/52* (2010.01)

(52) U.S. Cl. ........ 313/501; 313/485; 313/487; 313/498; 362/84; 362/231

(58) Field of Classification Search .................... 362/84, 362/231; 313/483–487, 498–512
See application file for complete search history.

(56) References Cited

U.S. PATENT DOCUMENTS 5,813,752 A 9/1998 Singer et al.
5,813,753 A * 9/1998 Vriens et al. .................. 313/112
2003/0026095 A1* 2/2003 Tseng ........................... 362/227
2006/0126326 A1 6/2006 Ng et al.
2007/0223219 A1 9/2007 Medendorp, Jr. et al.
2008/0203898 A1 8/2008 Kobayashi
2008/0266690 A1* 10/2008 Toda et al. .................... 359/885

FOREIGN PATENT DOCUMENTS

CN 101142504 3/2008
CN 101257037 9/2008
JP 2007-173557 7/2007
JP 2007173557 A * 7/2007
WO 2006/097794 9/2006

OTHER PUBLICATIONS

The Chinese Office Action dated May 18, 2011 and English translation thereof.
The Chinese Office Action dated May 15, 2012 and the English translation thereof.
Office Action from the European Patent Office dated Aug. 30, 2012.

* cited by examiner

*Primary Examiner* — Mariceli Santiago
(74) *Attorney, Agent, or Firm* — Bacon & Thomas, PLLC

(57) ABSTRACT

A light source apparatus includes a first light emitter, a second light emitter, and a third light emitter. The first light emitter has a peak wavelength within the range from 600 nm to 660 nm and a wavelength range at half peak intensity wider than the range from 600 nm to 660 nm, the second light emitter has a peak wavelength within the range from 530 nm to 570 nm and a wavelength range at half peak intensity wider than the range from 530 nm to 570 nm, and the third light emitter which a peak wavelength is 420 nm-470 nm in a spectral power distribution thereof.

8 Claims, 14 Drawing Sheets

*FIG.2*

| | EXAMPLE 1 | EXAMPLE 2 | WARM WHITE FLUORESCENT LAMP | CONV. EX. 1 | CONV. EX. 2 |
|---|---|---|---|---|---|
| PEAK WAVELENGTH OF FIRST LIGHT EMITTER [nm] | 630 | 660 | – | 620 | 650 |
| PEAK WAVELENGTH OF SECOND LIGHT EMITTER [nm] | 530 | 530 | – | 550 | 550 |
| PEAK WAVELENGTH OF THIRD LIGHT EMITTER [nm] | 460 | 460 | – | 455 | 455 |
| COLOR TEMPERATURE [K] | 2650 | 2650 | 3000 | 2600 | 2600 |
| R a | 92 | 86 | 84 | 86 | 52 |
| MELATONIN SUPPRESSING EFFICIENCY [%] (VS WARM WHITE FLUORESCENT LAMP) | – | – | 100 | – | – |

FIG. 6

| | EXAMPLE 3 | EXAMPLE 4 | WARM WHITE FLUORESCENT LAMP | CONV. EX. 1 | CONV. EX. 2 |
|---|---|---|---|---|---|
| PEAK WAVELENGTH OF FIRST LIGHT EMITTER [nm] | 625 | 625 | - | 620 | 650 |
| PEAK WAVELENGTH OF SECOND LIGHT EMITTER [nm] | 530 | 540 | - | 550 | 550 |
| PEAK WAVELENGTH OF THIRD LIGHT EMITTER [nm] | 460 | 460 | - | 455 | 455 |
| COLOR TEMPERATURE [K] | 2650 | 2600 | 3000 | 2600 | 2600 |
| R a | 93 | 83 | 84 | 86 | 52 |
| MELATONIN SUPPRESSING EFFICIENCY [%] (VS WARM WHITE FLUORESCENT LAMP) | - | 50 | 100 | - | - |

FIG. 11

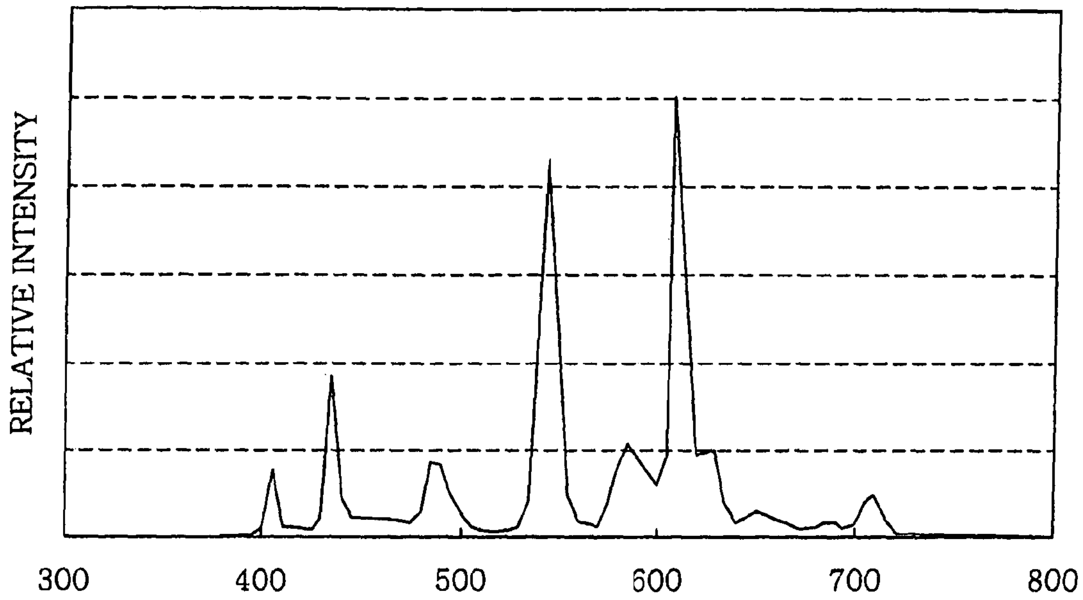

FIG. 12

$$\text{RELATIVE MELATONIN SUPPRESSING EFFICIENCY (\%)} = \left[ \frac{\int_{380}^{780} S(\lambda)B(\lambda)d\lambda}{\int_{380}^{780} S(\lambda)V(\lambda)d\lambda} \Big/ \frac{\int_{380}^{780} S_0(\lambda)B(\lambda)d\lambda}{\int_{380}^{780} S_0(\lambda)V(\lambda)d\lambda} \right] \times 100$$

$S(\lambda)$ ···· SPECTRAL POWER DISTRIBUTION OF LIGHT SOURCE $S_0(\lambda)$ ···· SPECTRAL POWER DISTRIBUTION OF REFERENCE LIGHT SOURCE $V(\lambda)$ ···· LUMINOUS EFFICACY $B(\lambda)$ ···· ACTION SPECTRUM OF MELATONIN

*FIG. 14*
*(PRIOR ART)*

| | CONV. EX.1 | CONV. EX.2 | WARM WHITE FLUORESCENT LAMP |
|---|---|---|---|
| PEAK WAVELENGTH OF FIRST LIGHT EMITTER [nm] | 620 | 650 | – |
| PEAK WAVELENGTH OF SECOND LIGHT EMITTER [nm] | 550 | 550 | – |
| PEAK WAVELENGTH OF THIRD LIGHT EMITTER [nm] | 455 | 455 | – |
| COLOR TEMPERATURE [K] | 2600 | 2600 | 3000 |
| R a | 86 | 52 | 84 |
| MELATONIN SUPPRESSING EFFICIENCY [%] (VS WARM WHITE FLUORESCENT LAMP) | – | – | 100 |

LIGHT SOURCE APPARATUS

FIELD OF THE INVENTION

The present invention relates to a light source apparatus having light emitters for emitting a red, a blue, and a green light, respectively.

BACKGROUND OF THE INVENTION

Conventionally, there is proposed a light source apparatus for the replacement of a white light source such as an incandescent lamp, a fluorescent lamp or the like. The light source apparatus achieves a high color rendering property by using light emitting diodes emitting a red, a green, and a blue light and selecting a wavelength range of each light emitting diode in a specific range.

For example, there is disclosed a light source apparatus which has a red light emitter having a peak wavelength within the range from 600 nm to 660 nm, a green light emitter having a peak wavelength within the range from 530 nm to 570 nm, and a blue light emitter having a peak wavelength within the range from 420 nm to 470 nm, as shown in a table of FIG. 14 and a spectral power distribution depicted in FIG. 15 (see, e.g., Japanese Patent Application Publication No. 2007-173557).

In the above-mentioned examples, although melatonin suppressing efficiencies are low, there cannot be achieved a good color rendering property when lights emitted from the light emitters have sharp peak wavelengths. Furthermore, when any one of the peak wavelengths is deviated from the desired range in one or more light emitters, the color rendering property is deteriorated.

For example, as can be seen from FIG. 14, all of the peak wavelengths are within the above-mentioned ranges in the conventional examples 1 and 2 where the red light emitters thereof have a 620 nm peak wavelength and a 650 nm peak wavelength, respectively. However, the conventional example 2 has a color rendering index (Ra) lower than the conventional examples 1, in which Ra is a value indicating the color rendering property. It is thought because the conventional example 2 uses light emitters emitting light having a relatively sharp peak wavelength compared to the conventional example 1.

In case of the conventional example 1, a melatonin suppressing efficiency is high, though the color rendering property is good. In order to lower the melatonin suppressing efficiency, there can be considered a light source apparatus as shown in the conventional example 2 in which the peak wavelength of the red light emitter is 650 nm, which is shifted from the 620 nm peak wavelength of the red light emitter in the conventional example 1, as shown in FIGS. 14 and 15.

In the conventional example 2, however, a color rendering index (Ra) which is a measure of a color rendering property is lowered as shown in FIG. 14. As shown in the conventional examples 1 and 2, increasing the rendering effect and lowering the melatonin suppressing efficiency has a trade off relation, which is believed to be due to relatively sharp peak characteristics of the light emitters (FIG. 15) employed therein.

SUMMARY OF THE INVENTION

In view of the above, the present invention provides a light source apparatus having a high color rendering property and a low melatonin suppressing efficiency by using light emitters having broad peaks.

In accordance with an embodiment of the present invention, there is provided a light source apparatus including A light source apparatus including a first light emitter having a peak wavelength within the range from 600 nm to 660 nm and a wavelength range at half peak intensity wider than the range from 600 nm to 660 nm; a second light emitter having a peak wavelength within the range from 530 nm to 570 nm and a wavelength range at half peak intensity wider than the range from 530 nm to 570 nm. Further, the light source apparatus includes a third light emitter which a peak wavelength is disposed within the range from 420 nm to 470 nm in a spectral power distribution thereof.

With the above configuration, since spectral power distribution curves of the first and the second light emitter have broad peaks, respectively, the color rendering property of the apparatus is hardly influenced by variations of peak wavelengths, thereby improving the color rendering property thereof.

In the light source apparatus, each of the first and second light emitter may include light emitting diodes serving as a light source having a peak wavelength below 530 nm, and a visible light component below 480 nm of the first light emitter may be substantially zero.

With this configuration, each of the first and second light emitter include light emitting diodes emitting light having a peak wavelength below 530 nm and a light emitted by the first light emitter hardly include a visible light component below 480 nm. Therefore, the light emitted by each of the first and second light emitter includes few wavelength components induced by its own light source and long wavelength components of the light are compensated. Accordingly, a variable range in a color temperature can be broadened, the color rendering property can be improved and the low melatonin suppressing efficiency is lowered.

In the light source apparatus, a visible light component below 480 nm of the second light emitter may be substantially zero.

With this configuration, since lights emitted by the first and the second light emitter hardly includes visible light components, wavelength components playing a role in melatonin suppressing are effectively excluded while a good color rendering property is being kept. Therefore, if the above mentioned light source apparatus is applied in a light source for normal illumination, it can efficiently prohibit the suppression of melatonin production.

In the light source apparatus, each of the first and the second light emitter may include a light source having a peak wavelength below 530 nm and a color converting member provided near the light source.

With this configuration, a light of desirable wavelength can be obtained and the color rendering property is improved.

In the light source apparatus, the light source may be a light emitting diode and the light emitting diode may be covered by a resin made of a color converting material containing a component absorbing a visible light component below 480 nm.

With this configuration, wavelength components playing a role in suppressing melatonin production can be excluded by using the color converting material, e.g., resin covering the light emitting diode and absorbing 480 nm or less visible light components among lights emitted by the first and the second light emitter, while the color rendering property is being kept. Further, if the above mentioned light source apparatus is applied in a light source for normal illumination, it can efficiently prevent the suppression of melatonin production.

In the light source apparatus, the color converting member may include an optical multi-layered film or fluorescent material.

With this configuration, wavelength components playing a role in suppressing melatonin production can be excluded by using the color converting member covering the light emitting diode and absorbing 480 nm or less visible light components among lights emitted by the first and the second light emitter, while the color rendering property of the apparatus is being kept. Further, if the above mentioned light source apparatus is applied in a light source for normal illumination, it can efficiently prevent the suppression of melatonin production.

In the light source apparatus, each of the first and the second emitter may include a lens provided on the color converting member, the lens further may include a short wavelength cutoff filter which cuts off a visible light component below 480 nm.

With this configuration, wavelength components playing a role in suppressing melatonin production can be excluded by using the lens including the short wavelength cut filter provided in the resin including the optical multi-layered film covering the light emitting diode, and absorbing 480 nm or less visible light components among lights emitted by the first and the second light emitter, while the color rendering property is being kept. Further, if the above mentioned light source apparatus is employed in a light source for normal illumination, it can efficiently prevent the suppression of melatonin production.

With the light source apparatus in accordance with the present invention, a color rendering property can be improved without suppression of the melatonin production.

BRIEF DESCRIPTION OF THE DRAWINGS

The objects and features of the present invention will become apparent from the following description of preferred embodiments, given in conjunction with the accompanying drawings, in which:

FIG. 2 is a table illustrating a color rendering property and a relative melatonin suppressing efficiency of the light source apparatus in accordance with the first embodiment of the present invention, comparing with an warm white fluorescent lamp and conventional examples;

FIG. 6 is a table illustrating a color rendering property and a relative melatonin suppressing efficiency of the light source apparatus in accordance with the second embodiment of the present invention, comparing with an warm white fluorescent lamp and conventional examples;

FIG. 11 depicts a spectral power distribution of the warm white fluorescent lamp as a comparative example;

FIG. 12 describes a formula for calculating the relative melatonin suppressing efficiency;

FIG. 14 illustrates color rendering properties and relative melatonin suppressing efficiencies of light source apparatuses in accordance with conventional examples comparing with the warm white fluorescent lamp.

DETAILED DESCRIPTION OF THE EMBODIMENTS

Hereinafter, light source apparatuses in accordance with embodiments of the present invention will be described in more detail with reference to accompanying drawings which form a part hereof.

<First Embodiment>

Figure 1:
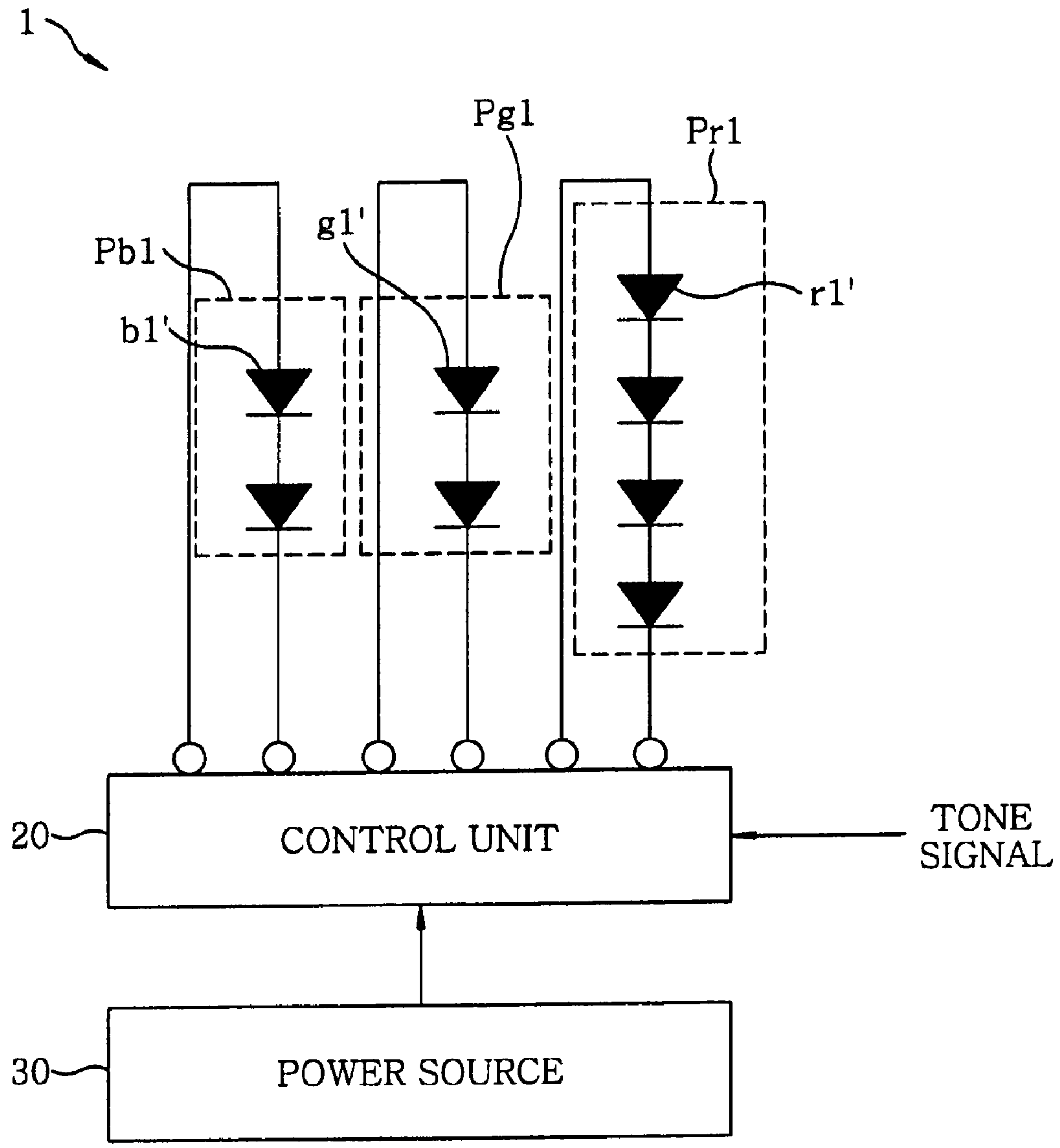
FIG. 1 shows a schematic configuration of a light source apparatus in accordance with a first embodiment of the present invention.

FIG. 1 schematically shows a configuration of a light source apparatus in accordance with a first embodiment of the present invention.

Referring to FIG. 1, the light source apparatus 1 includes a first, a second, and a third light emitter Pr1, Pr2, Pr3, which are provided adjacent to each other and are connected to a control unit 20 to which a tone signal to control the outputs of the light emitters Pr1 to Pr3 can be applied, respectively. The control unit 20 is supplied with power from a power source 30.

The first light emitter Pr1 includes one or more, e.g., 4, light emitting diode (LED) units r1', each emitting a red light having a peak wavelength within the range from 600 nm to 660 nm and a wavelength range at half peak intensity wider than the range from 600 nm to 660 nm. That is, the wavelength of the peak at the maximum intensity is between 600 nm and 660 nm and the minimum and the maximum wavelength of the peak at the half maximum intensity is less than 600 nm and greater than 660 nm, respectively (see, e.g., FIG. 8C). The second light emitter Pg1 includes one or more, e.g., LED units g1', each emitting a green light having a peak wavelength within the range from 530 nm to 570 nm and a wavelength range at half peak intensity wider than the range from 530 nm to 570 nm (see, e.g., FIG. 8B).

Figure 8A:
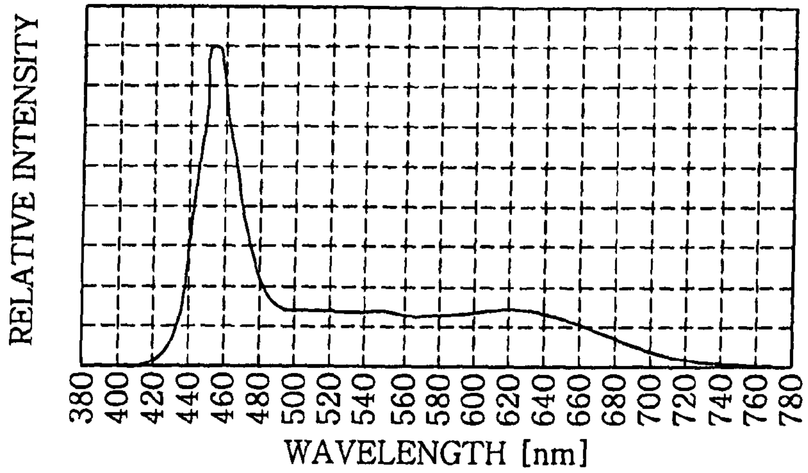
FIGS. 8A to 8C depict spectral power distributions of the first to the third light emitters in the second embodiment, respectively.
Figure 8B:
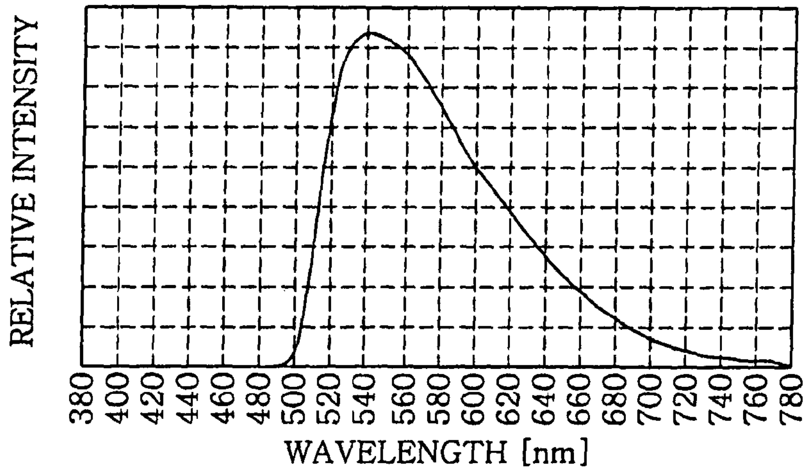
Figure 8C:
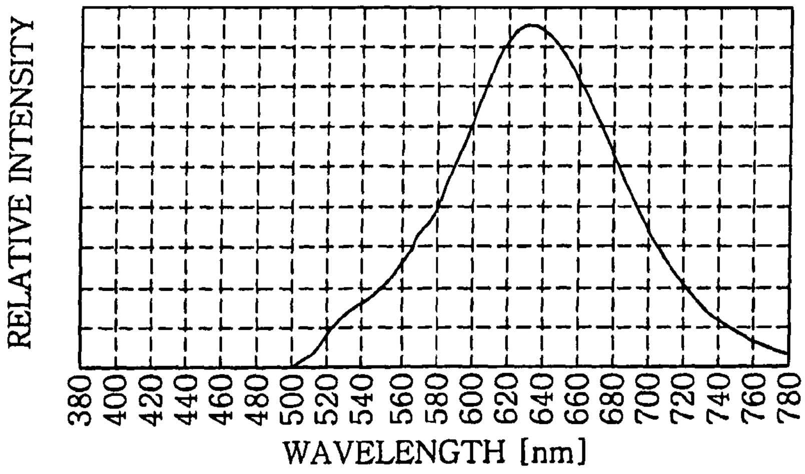

Further, the third light emitter Pb1 includes one or more, e.g., 2, LED units b1', each emitting a blue light, which has a peak wavelength within the range from 420 nm to 470 nm (see, e.g., FIG. 8A).

EXAMPLES 1 AND 2

Hereinafter, examples 1 and 2 of the light source apparatus 1 will be explained in which peak wavelengths of the light emitters Pr1, Pg1, Pb1 are set within the range described above.

Figure 3:
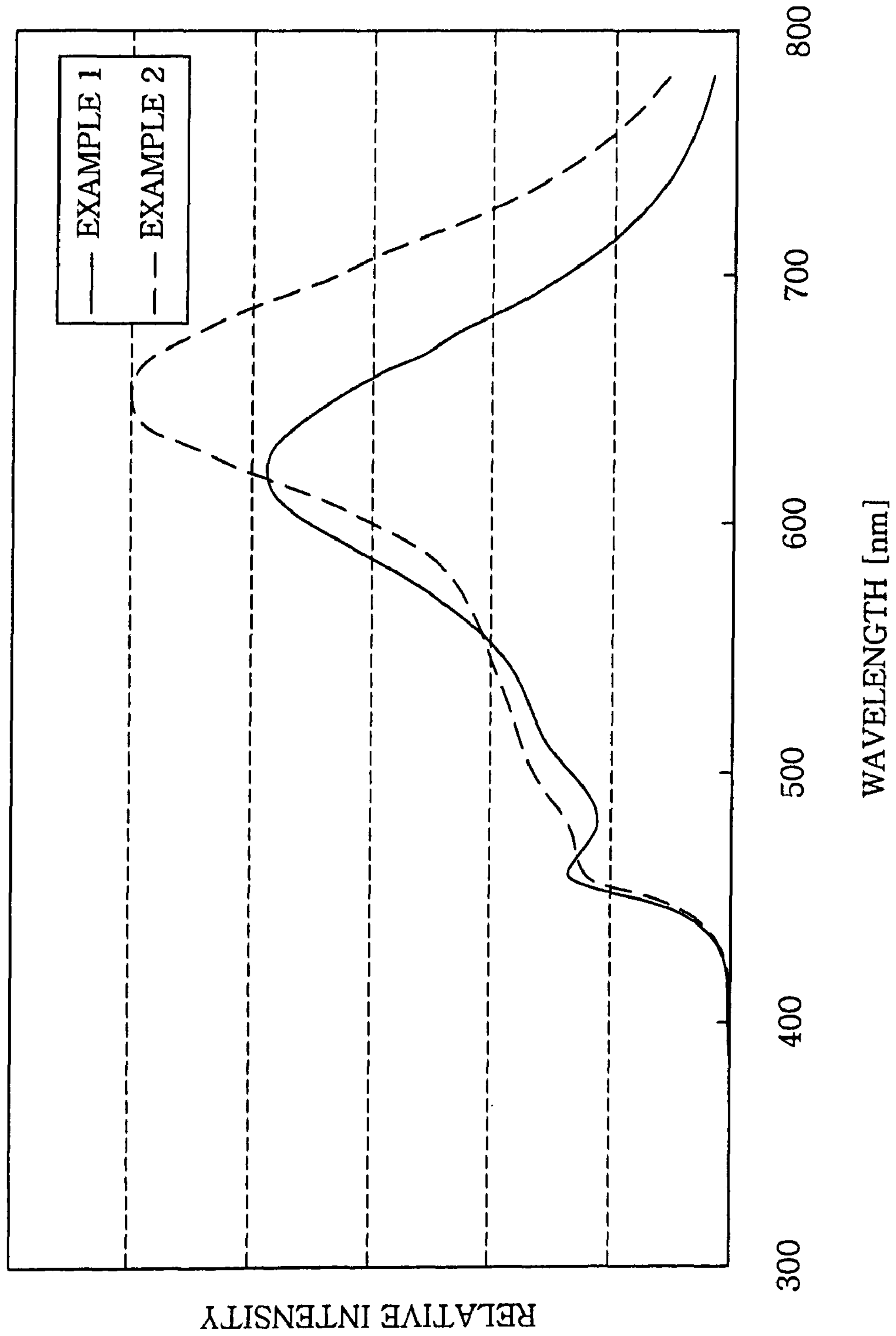
FIG. 3 depicts a spectral power distribution of the light source apparatus in accordance with the first embodiment.

FIG. 2 is a table describing a peak wavelength for each of the light emitters Pr1, Pg1, Pb1, and a color rendering index Ra for the examples 1 and 2, together with those for the conventional examples 1, 2 as comparative examples. FIG. 3 shows spectral power distributions of lights emitted by the examples 1 and 2.

Ra is determined based on JISZ 8726. As Ra is closer to 100, a light source reproduces the colors of various objects closer to those in natural light. Generally, if Ra is 80 or more, color rendering is considered to be sufficient.

The relative melatonin suppressing efficiency indicates an efficiency suppressing melatonin secretion and is calculated by the formula shown in FIG. 12 and is expressed in percentage using a warm white fluorescent lamp as a reference.

Figure 13:
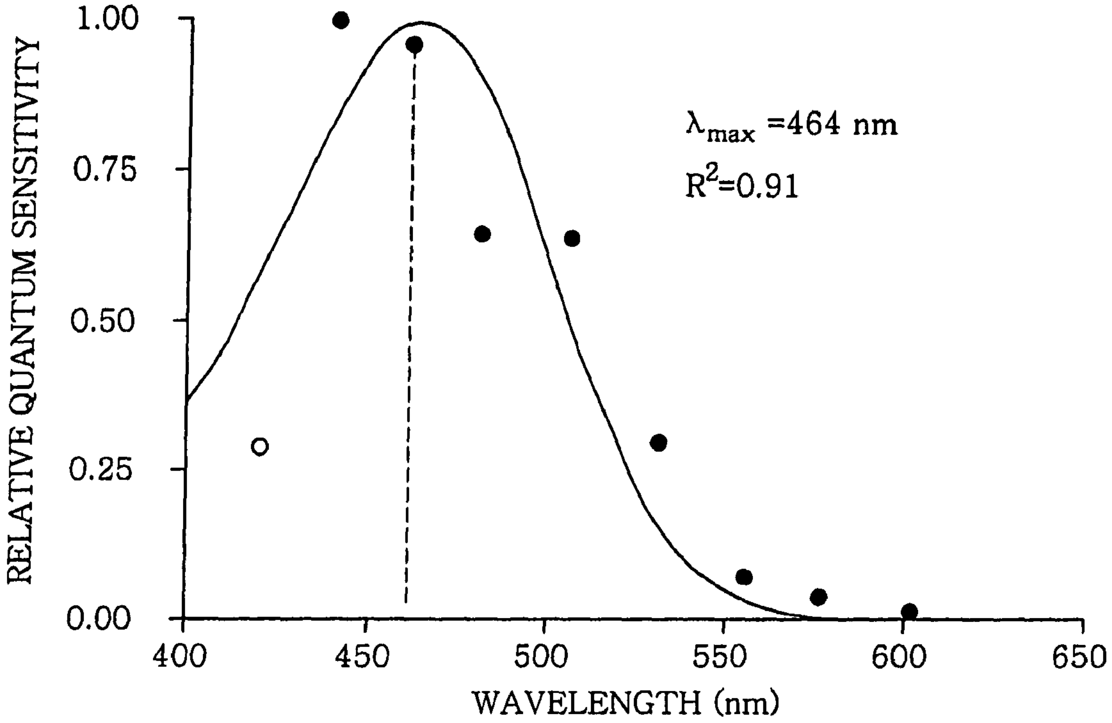
FIG. 13 shows a response spectrum of the melatonin.

The melatonin is a hormone produced by the pineal gland in the brain and secreted in a large amount during a period from just before going to sleep to a first half of a deep sleep. Further, the melatonin is known to cause lowering a body temperature and drowsiness. Moreover, it is known that secretion of the melatonin is suppressed upon receiving a light during a night time and an action spectrum is reported which illustrates wavelength characteristics as shown in FIG. 13. Referring to FIG. 13, a melatonin suppression sensitivity has a peak at a 464 nm and, therefore, suppressing of the melatonin production during the night time can be prevented by blocking the wavelength therearound.

In the example 1 as shown in FIG. 2, the first light emitter Pr1 includes LED units r1', each emitting a red light whose peak wavelength is 630 nm, the second light emitter Pg1 includes LED units g1', each emitting a green light whose peak wavelength is 530 nm, and the third light emitter Pb1 includes LED units b1', each emitting a blue light whose peak wavelength is 460 nm. Further, the first and the second light emitters Pr1 and Pg1 have broad peaks as described above.

A spectral power distribution of the light emitted by the light source apparatus 1 of the example 1 configured as above is shown by a solid line in FIG. 3.

The example 2 differs from the example 1 in that the first light emitter Pr1 includes one or more LED units, each emitting a red light having a 660 nm peak wavelength. The others are same as in the example 1.

A spectral power distribution of the light emitted by the light source apparatus 1 of the example 2 configured as above is shown by a dotted line in FIG. 3.

FIG. 11 shows a spectral power distribution of a warm white fluorescent lamp illustrated as a comparative example.

Figure 15:
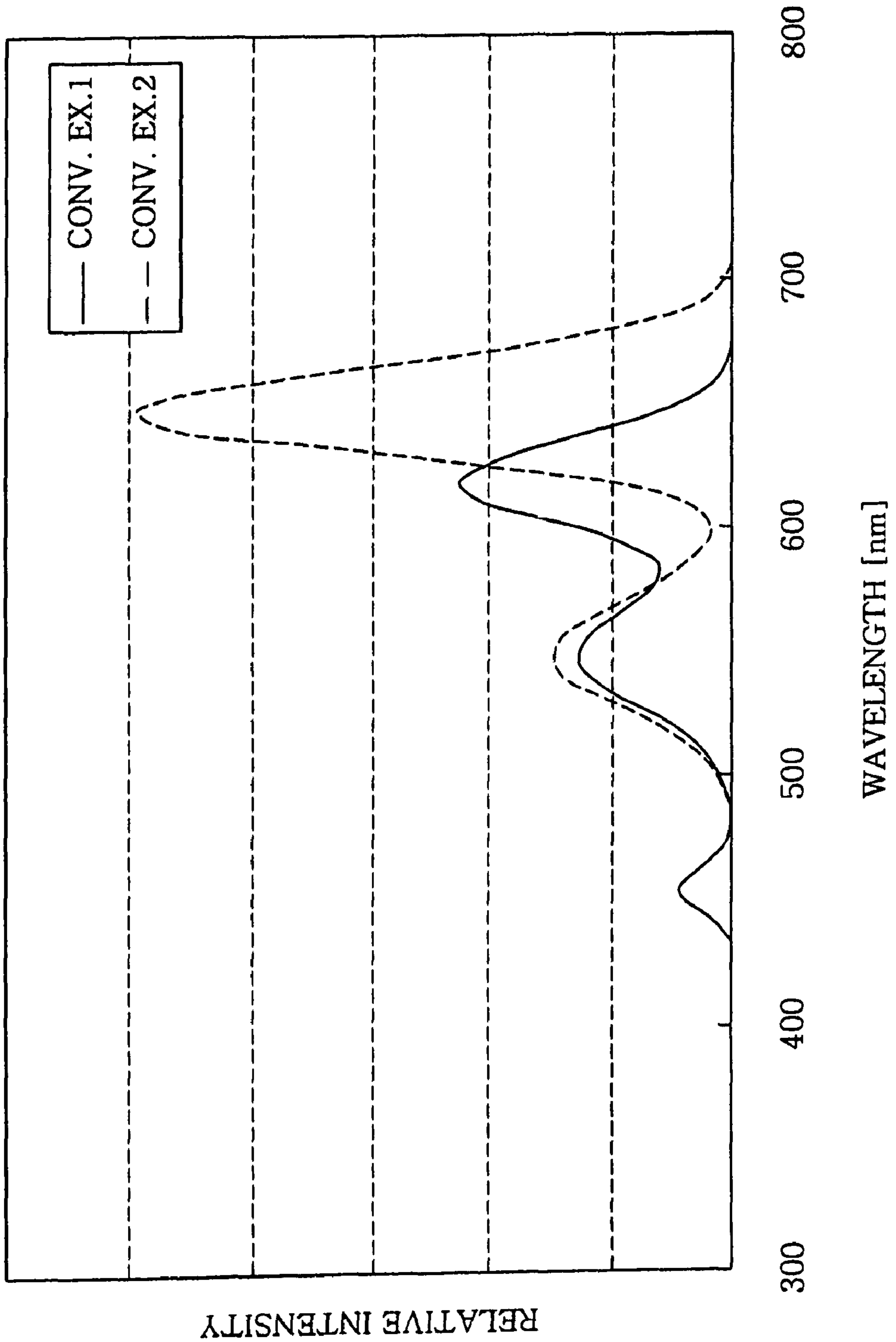
FIG. 15 (PRIOR ART)
FIG. 15 depicts spectral power distributions of the light source apparatuses of the conventional examples.

Further, a light source apparatus of each of the conventional examples 1 and 2 includes three light emitters having peak wavelengths as shown in the table of FIG. 14, respectively, and spectral power distributions thereof are depicted by a solid and a dotted line in FIG. 15, respectively.

Referring to FIG. 2, Ra is 92 in the example 1, and it is greater than that of the warm white fluorescent lamp and indicates a high color rendering property.

Meanwhile, Ra is 86 in the example 2, which is lower than that in the example 1 but is sufficiently high.

Further, it represents a significant improvement when compared to the conventional example 2 against the conventional example 1.

As described above, with the light source apparatuses 1 in accordance with the example 1 and 2, a high color rendering property can be achieved and, therefore, they are suitable for a light source apparatus of indoor illumination system.

<Second Embodiment>

Figure 4:
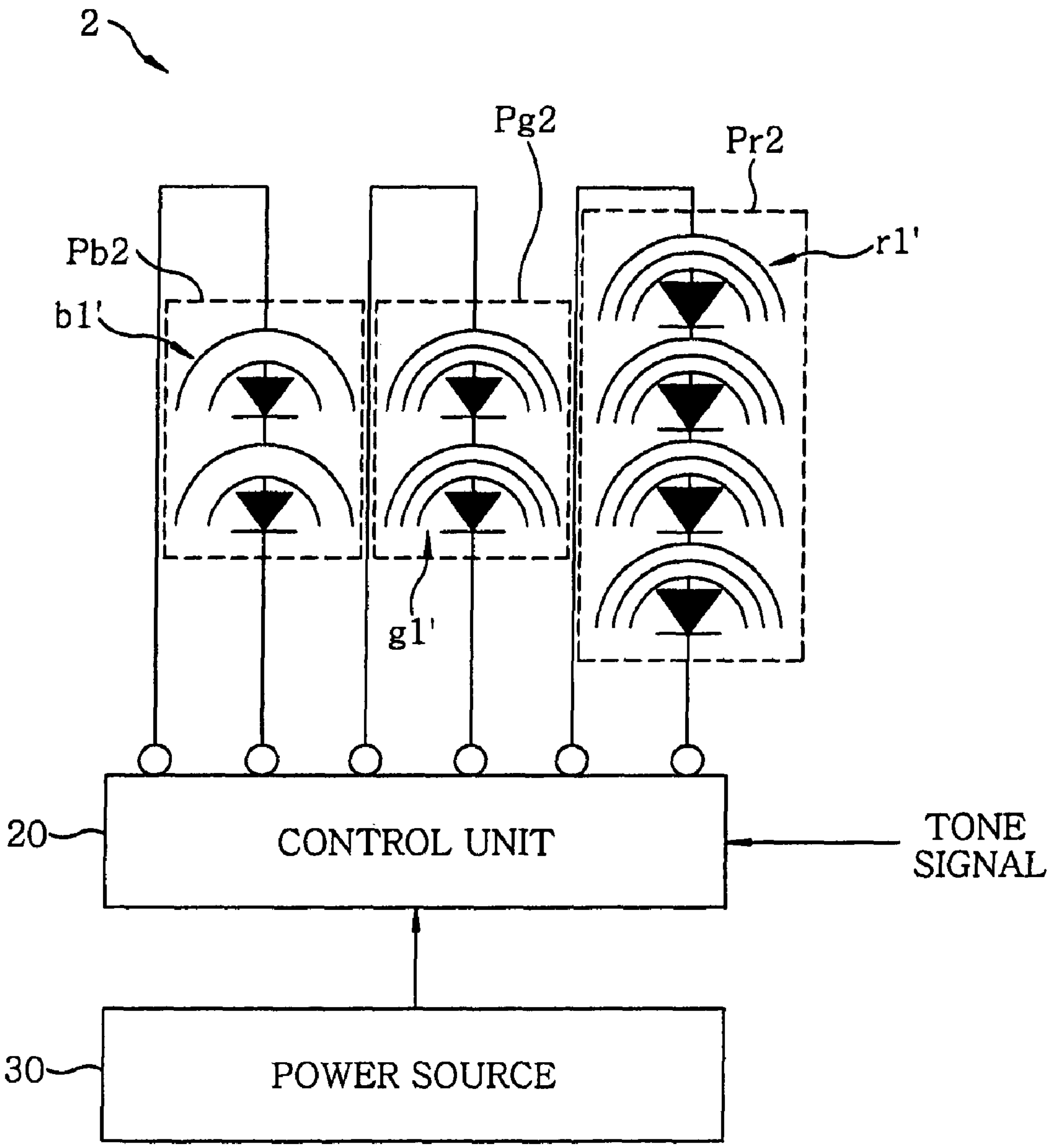
FIG. 4 shows a schematic configuration of a light source apparatus in accordance with a second embodiment of the present invention.

FIG. 4 schematically shows a configuration of a light source apparatus 2 in accordance with a second embodiment of the present invention.

Referring to FIG. 4, the light source apparatus 2 of the second embodiment includes a first light emitter Pr2 having one or more, e.g., 4, LED units r1', a second light emitter Pg2 having one or more, e.g., 2, LED units g1', and a third light emitter Pb2 having one or more, e.g., 2, LED units bi', which are disposed adjacent to each other and connected to the control unit 20, respectively.

Figure 5A:
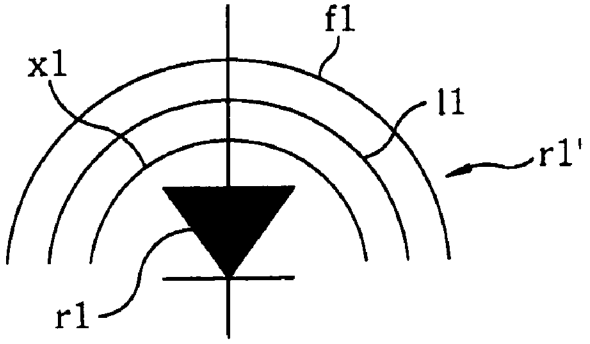
FIGS. 5A to 5C illustrate schematic configurations of first to third light emitters in the light source apparatus in accordance with the second embodiment, respectively.
Figure 5B:
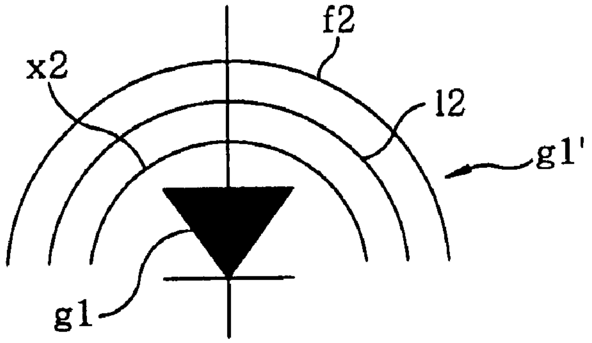
Figure 5C:
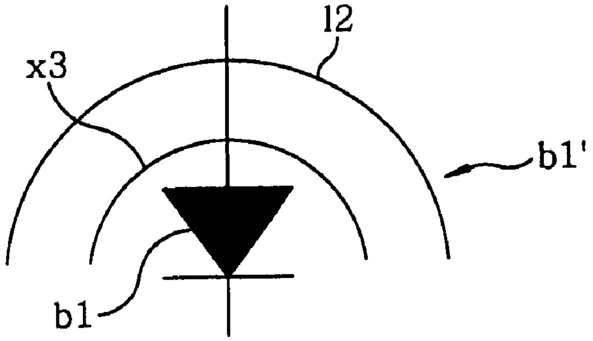

FIGS. 5A to 5C illustrate schematic configurations of the LED units of the first, the second, and the third light emitter Pr2, Pg2, and Pb2, respectively, in accordance with the second embodiment.

Referring to FIG. 5A, each LED unit r1' of the first light emitter Pr2 includes an LED r1, a color (or wavelength) converting unit x1 provided to cover an emitting portion of the LED unit r1', and a short wavelength cutoff filter f1 arranged over the color converting unit x1. Further, the LED r1 emits a red light having a peak wavelength disposed within the range from 600 nm to 660 nm and wavelength range at half peak intensity wider than the range from 600 nm to 660 nm.

The LED r1 emits a light having a peak wavelength less than 530 nm. The color converting unit x1 is, e.g., an optical member made of an optical multi-layered film, a transparent resin or fluorescent material. The color converting unit x1 serves to absorb the light emitted from the LED r1 and produce the red light having a peak wavelength disposed within the range from 600 nm to 660 nm and wavelength range at half peak intensity wider than the range from 600 nm to 660 nm.

Further, the cutoff filter f1 is formed by mixing an inorganic or organic pigment of azo system, pyrazolone system, quinophthalone system, flavantfrone system or the like, or a yellow dye, into translucent or transparent resins such as acryl, polycarbonate, silicone or the like. The cutoff filter f1 serves to block a visible light below 480 nm wavelength down to almost zero level. Further, a yellow glass, a glass on which a paint or a varnish containing the above-described pigment or the like is applied, an optical multi-layered film, or the like can be used instead.

The color converting unit x1 and the cutoff filter f1 may be integrated as a single body. They may be integrated, e.g., by mixing the color converting unit x1 and the above-mentioned pigment, or forming or applying an optical multi-layered film on the color converting unit x1.

Additionally, a lens portion 11 may be provided on the color converting unit x1 and the above-mentioned pigment or the like may be mixed in the lens portion 11. The lens portion may be made of a color glass. Alternatively, the color converting unit x1, the lens portion 11, and the cutoff filter f1 may be integrated as a single body, by integrating the color converting unit x1 and the cutoff filter f1 with the lens portion 11 by coating or forming an optical multi-layered film on the lens portion. Further, the stacking sequence may be changed different from the example shown in FIG. 5A. For example, the lens portion 11 may be disposed on the cutoff filter f1.

Referring to FIG. 5B, each LED unit g1' of the second light emitter Pg2 includes an LED g1, a color converting unit x2 provided to cover an emitting portion of the LED g1, and a short wavelength cutoff filter f2 arranged over the color converting unit x2. A lens 12 may also be provided on the color converting unit x2. Further, the LED unit g1' emits a green light having a peak wavelength disposed within the range from 530 nm to 570 nm and wavelength range at half peak intensity wider than the range from 530 nm to 570 nm.

The LED g1 emits a light having a peak wavelength less than 530 nm. The LED g1 may or may not be the same as the LED r1. The cutoff filter f1 serves to block a visible light below 480 nm wavelength down to almost zero level. The color converting unit x2 serves to absorb the light emitted from the LED g1 and produce the green light having a peak wavelength disposed within the range from 530 nm to 570 nm and wavelength range at half peak intensity wider than the range from 530 nm to 570 nm. The cutoff filter f1 serves to block a visible light below 480 nm wavelength down to almost zero level.

Further, configurations and manufacturing methods of the color converting unit x2, the cutoff filter f2, and the lens 12 are same as those of the color converting unit x1, the cutoff filter f1, and the lens 11 in the first light emitter Pr1, respectively, and thus a description thereof will be omitted. The disposition of the color converting unit x2, the cutoff filter f2, and the lens 12 is not limited to the above-mention disposition and, e.g., the lens may be disposed over the cutoff filter.

Referring to FIG. 5C, each LED unit b1' of the third light emitter Pb2 includes an LED b1 and a color converting unit x3. A lens 13 may be provided over the LED b1. Further, the LED b1 emits a blue light having a peak wavelength within the range from 420 nm to 470 nm. The color converting unit x3 may be omitted.

Further, configuration and manufacturing method of the lens 13 is same as that of the lens 11 in the first light emitter Pr1, and a description thereof will be omitted.

EXAMPLES 3 AND 4

Hereinafter, examples 3 and 4 of the light source apparatus 2 will be explained in which peak wavelengths of the light emitters Pr1, Pg2, and Pb2 are set within the range described above.

Figure 7:
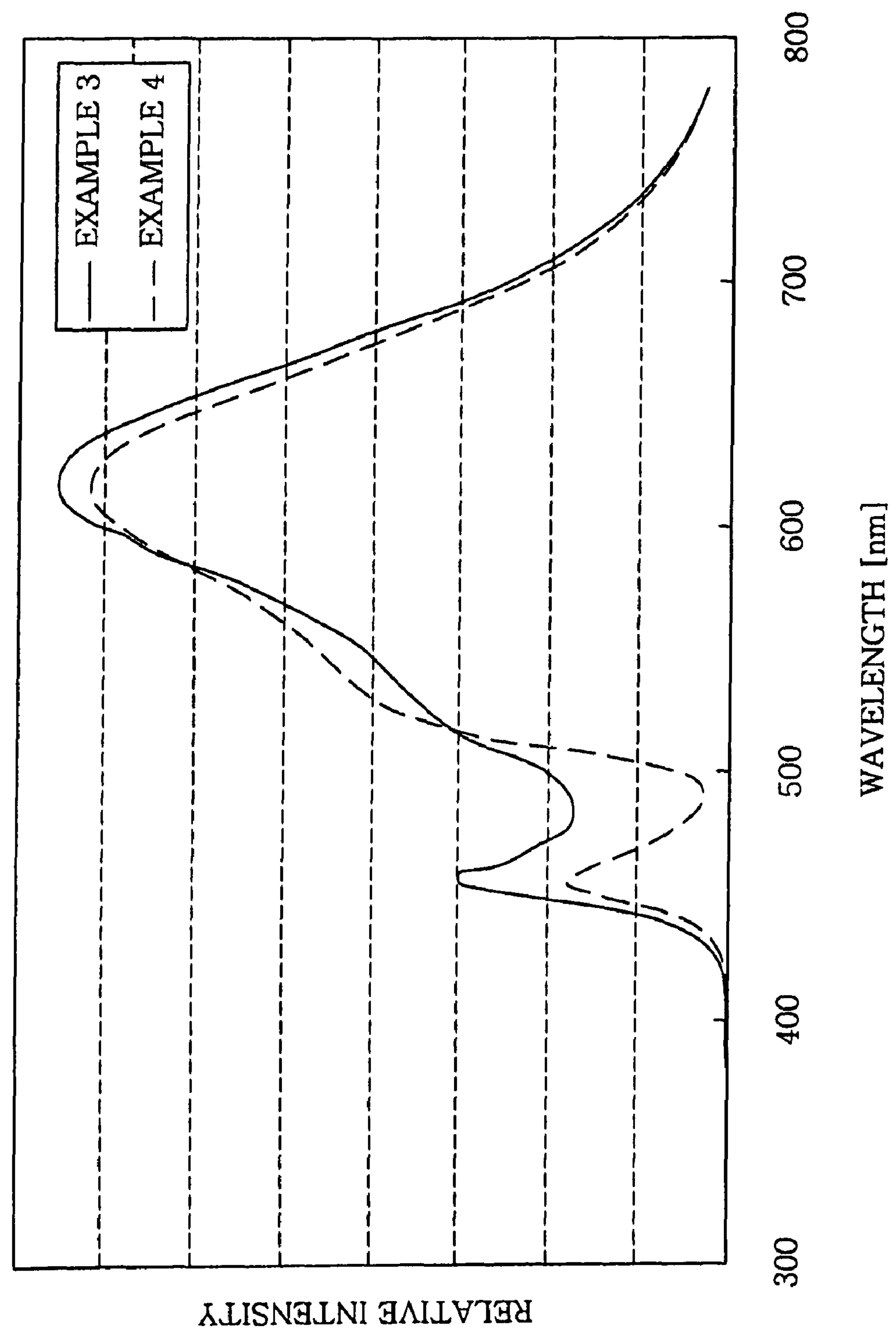
FIG. 7 depicts a spectral power distribution of the light source apparatus in accordance with the second embodiment.

FIG. 6 is a table describing a peak wavelength for each of the light emitters Pr2, Pg2, and Pb2, a color rendering index Ra for each of the example 3 and 4, and a relative melatonin suppressing efficiencies for the example 4, together with those for a warm white fluorescent lamp and conventional examples 1 and 2 as comparative examples. FIG. 7 shows a spectral power distribution of light emitted by the examples 3 and 4.

As in the first embodiment, Ra is determined based on JISZ 8726 and the melatonin suppressing efficiency is expressed in percentage using a warm white fluorescent lamp as a reference.

In the example 3 as shown in FIG. 6, the first light emitter Pr2 emits a light having a 625 nm peak wavelength and hardly including visible light wavelengths below 480 nm. Further, the second light emitter Pg2 emits a light having a 530 nm peak wavelength and hardly including visible light wavelengths below 480 nm, and the third light emitter Pb2 emits a light having a 460 nm peak wavelength. Moreover, each of the first to third light emitters Pr2, Pg2, and Pb2 has broad peaks, as described above.

A spectral power distribution of the light emitted by the light source apparatus 2 of the example 3 configured as above is shown by a solid line in FIG. 7.

As shown in FIG. 6 and FIGS. 8A to 8C, the example 4 differs from the example 3 in that the second light emitter Pg2 emits a light having a peak wavelength shifted from that in the example 3. Specifically, the second light emitter Pg2 of the example 3 emits a light having a 540 nm peak wavelength and hardly including visible light wavelengths below 480 nm which is blocked by the cutoff filter f2. Further, the first light emitter Pr2 emits a light having a 625 nm peak wavelength and hardly including visible light wavelengths below 480 nm, and the third light emitter Pb2 emits a light having a 455 nm peak wavelength.

Figure 9:
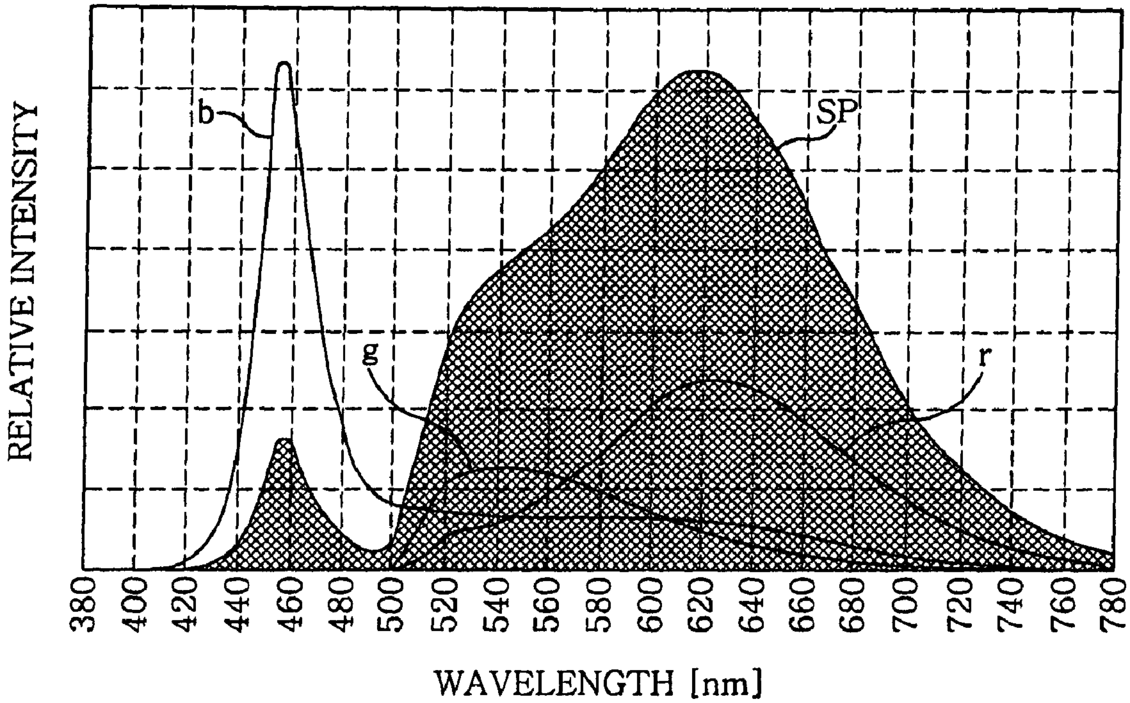
FIG. 9 shows by using a SP a spectral power distribution of the light source apparatus in accordance with the second embodiment.

A spectral power distribution of the light emitted by the light source apparatus 2 of the example 4 configured as above is shown by a dotted line in FIG. 7 and depicted by a spot photometry (SP) in FIG. 9. The curves r, g, and b represent the spectral power distribution of the example 4 shown in FIGS. 8A to 8C, wherein the relative intensity of the curve b is exaggerated for the sake of illustration.

FIG. 11 shows a spectral power distribution of the warm white fluorescent lamp as a comparative example.

Further, light source apparatuses of the conventional example 1 and 2 include three light emitters emitting lights having peak wavelengths as shown in a table of FIG. 14, respectively, and spectral power distributions thereof are depicted by a solid and a dotted line in FIG. 15, respectively.

As seen in FIG. 6, Ra in the example 3 is 93, which is greater than those of the warm white fluorescent lamp and conventional examples 1 and 2.

Figure 10:
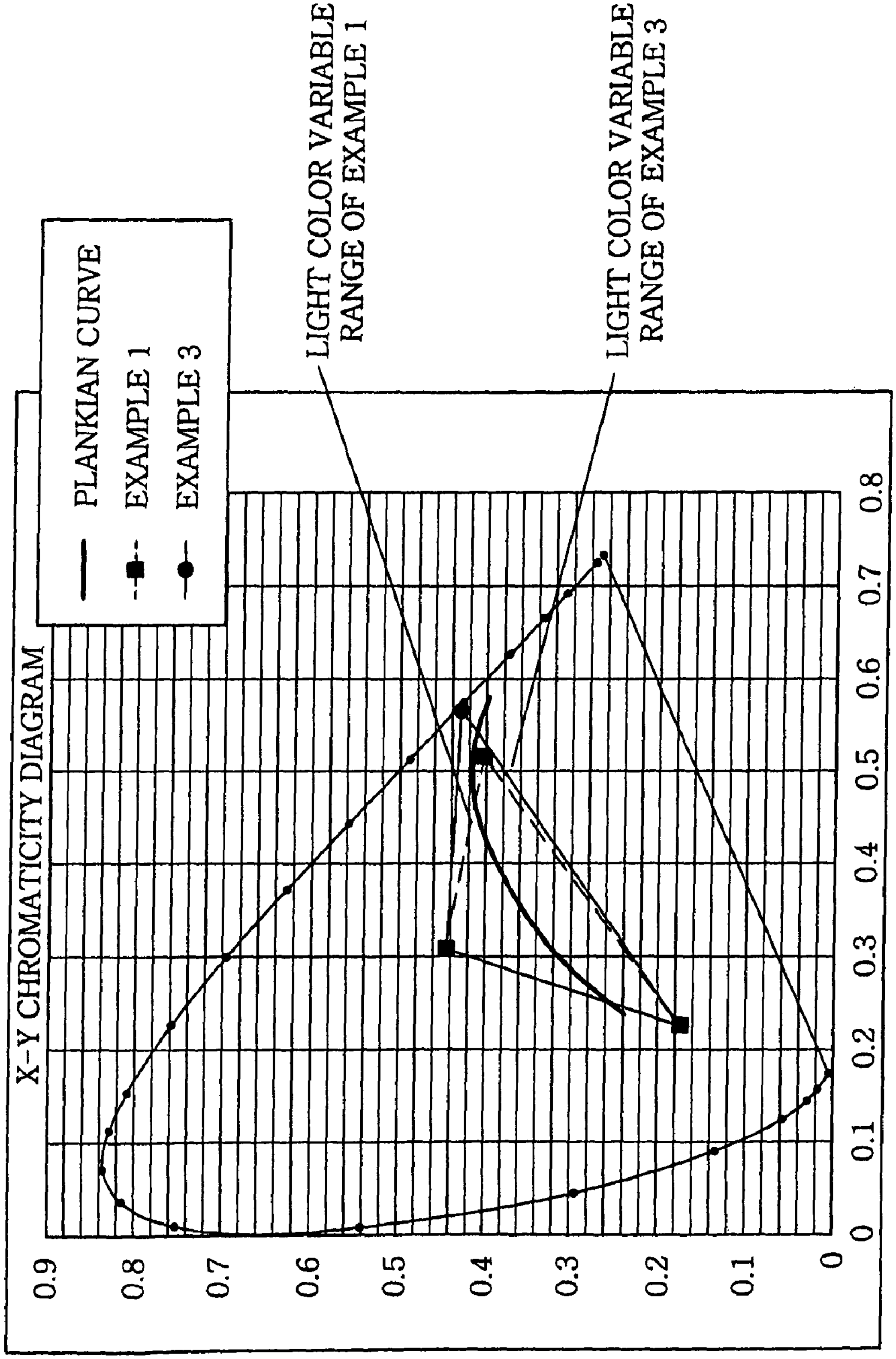
FIG. 10 illustrates a x-y chromaticity diagram of the light emitted by light source apparatus in accordance with the second embodiment of the present invention.

FIG. 10 illustrates an x-y chromaticity diagram showing light color variable ranges of the light emitted by the examples 1 and 3. As can be seen from FIG. 10, the light source apparatus 2 of the example 3 covers more of the Plankian (blackbody radiation) curve than the example 1 of the first embodiment and thus has a wider variable range of the color temperature.

Referring to FIG. 6, Ra is 83 in the example 4, which is lower than that in the example 3 but is sufficiently high.

Further, with the light source apparatus 2 of the example 4, a melatonin suppressing efficiency is 50, which is reduced by a half of that for the warm white fluorescent lamp. Therefore, it can be understood that the melatonin production suppressing action is weak. That is, when the light source apparatus 2 of the example 4 is used during sleep, the melatonin production is not suppressed.

Accordingly, illumination suitable for a good sleep can be obtained.

While the invention has been shown and described with respect to the embodiment, it will be understood by those skilled in the art that various changes and modifications may be made without departing from the scope of the invention as defined in the following claims.

What is claimed is:

1. A white light source apparatus of an illumination system comprising:

a first light emitter having a peak wavelength within the range from 600 nm to 660 nm and a wavelength range at half peak intensity wider than the range from 600 nm to 660 nm;

a second light emitter having a peak wavelength within the range from 530nm to 570 nm and a wavelength range at half peak intensity wider than the range from 530 nm to 570 nm; and a third light emitter having a peak wavelength from 420 nm to 470 nm in a spectral power distribution thereof, wherein the third light emitter has a wavelength range at one eighth peak intensity wider than the range from 480 nm to 660 nm.

2. The white light source apparatus of claim 1, wherein each of the first and second light emitter includes a light emitting diode serving as a light source having a peak wavelength below 530 nm, and a visible light component below 480 nm of the first light emitter is substantially zero.

3. The white light source apparatus of claim 1, wherein a visible light component below 480 nm of the second light emitter is substantially zero.

4. The white light source apparatus of claim 2, wherein a visible light component below 480 nm of the second light emitter is substantially zero.

5. The white light source apparatus of claim 1, wherein each of the first and the second light emitter includes a light source having a peak wavelength below 530 nm and a color converting member provided near the light source.

6. The white light source apparatus of claim 5, wherein the light source is a light emitting diode and the light emitting diode is covered by a resin made of a color converting material containing a component absorbing a visible light component below 480 nm.

7. The white light source apparatus of claim 5, wherein the color converting member includes an optical multi-layered film or a fluorescent material.

8. The white source apparatus of claim 5, wherein each of the first and the second emitter further includes a lens provided on the color converting member, the lens including a short wavelength cutoff filter which cuts off a visible light component below 480 nm.

* * * * *